(12) United States Patent
Nebel et al.

(10) Patent No.: US 10,564,351 B2
(45) Date of Patent: Feb. 18, 2020

(54) SEMI-FINISHED PRODUCT, METHOD FOR THE PRODUCTION THEREOF AND COMPONENT PRODUCED THEREWITH

(71) Applicant: Fraunhofer-Gesellschaft zur Förderung der angewandten Forschung e.V., Munich (DE)

(72) Inventors: Christoph E. Nebel, Freiburg (DE); Christian Giese, Freiburg (DE)

(73) Assignee: FRAUNHOFER-GESELLSCHAFT ZUR FÖRDERUNG DER ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 15/912,147

(22) Filed: Mar. 5, 2018

(65) Prior Publication Data
US 2018/0252867 A1 Sep. 6, 2018

(30) Foreign Application Priority Data

Mar. 6, 2017 (EP) .................................. 17159462

(51) Int. Cl.
*G02B 6/12* (2006.01)
*G02B 6/13* (2006.01)
(Continued)

(52) U.S. Cl.
CPC ........ *G02B 6/12004* (2013.01); *C30B 25/205* (2013.01); *C30B 29/04* (2013.01);
(Continued)

(58) Field of Classification Search
CPC ................ G02B 6/12004; G02B 6/131; G02B 2006/12061; G02B 2006/12173; G02B 6/136; G02B 2006/12038
See application file for complete search history.

(56) References Cited

U.S. PATENT DOCUMENTS 5,426,340 A 6/1995 Higaki et al.
6,110,278 A * 8/2000 Saxena ................ C30B 25/18
117/101

(Continued)

FOREIGN PATENT DOCUMENTS

RU 2368031 * 9/2009
WO WO 2004/038470 A1 5/2004
WO WO 2008/089944 A2 7/2008

OTHER PUBLICATIONS

Lee et al. "Coupling of silicon-vacancy centers to a single crystal diamond cavity", published Apr. 2, 2012, vol. 20, No. 8, Optics Express 8896 (Year: 2012).*

(Continued)

*Primary Examiner* — Ellen E Kim
(74) *Attorney, Agent, or Firm* — Brinks Gilson & Lione

(57) ABSTRACT

A semi-finished product having a substrate with a first side and an opposite second side is provided, wherein at least one diamond layer is arranged on the first side, wherein the diamond layer comprises monocrystalline diamond and the substrate comprises a material different from the diamond layer. A method for producing such a semi-finished product is provided and an integrated optical component may be produced from the semi-finished product.

16 Claims, 4 Drawing Sheets

(51) Int. Cl.
*C30B 33/00* (2006.01)
*C30B 25/20* (2006.01)
*C30B 29/04* (2006.01)
*C30B 33/06* (2006.01)
*G02B 6/136* (2006.01)
*G02B 6/122* (2006.01)
*H01L 21/20* (2006.01)

(52) U.S. Cl.
CPC .............. *C30B 33/00* (2013.01); *C30B 33/06* (2013.01); *G02B 6/13* (2013.01); *G02B 6/131* (2013.01); *G02B 6/1221* (2013.01); *G02B 6/136* (2013.01); *G02B 2006/12038* (2013.01); *G02B 2006/12061* (2013.01); *G02B 2006/12173* (2013.01); *G02B 2006/12176* (2013.01); *G02B 2006/12178* (2013.01); *H01L 21/2007* (2013.01)

(56) References Cited

U.S. PATENT DOCUMENTS

| | | | |
|---|---|---|---|
| 7,594,968 B2* | 9/2009 | Hemley | C23C 16/274 117/106 |
| 8,936,774 B2* | 1/2015 | Godfried | C30B 25/02 423/446 |
| 2002/0053318 A1 | 5/2002 | Levy et al. | |
| 2003/0131787 A1 | 7/2003 | Linares et al. | |
| 2008/0134959 A1 | 6/2008 | Kasu et al. | |
| 2009/0001498 A1 | 1/2009 | Wang et al. | |
| 2009/0221131 A1 | 9/2009 | Kubota et al. | |
| 2013/0099264 A1 | 4/2013 | Zimmerman et al. | |
| 2013/0220214 A1 | 8/2013 | Noguchi | |
| 2014/0078011 A1* | 3/2014 | Zhu | H01Q 13/206 343/731 |
| 2015/0086153 A1 | 3/2015 | Ono et al. | |
| 2015/0218694 A1* | 8/2015 | Xu | C30B 25/02 428/64.1 |
| 2016/0208413 A1 | 7/2016 | Nebel et al. | |
| 2018/0209038 A1* | 7/2018 | Okahisa | C23C 16/01 |
| 2018/0266013 A1* | 9/2018 | Wort | C30B 25/18 |
| 2018/0323572 A1* | 11/2018 | Mildren | H01S 3/2308 |

OTHER PUBLICATIONS

"Optical Properties of CVD Diamond," dated Jun. 4, 2011, p. 1, published by Diamond Materials Advanced Diamond Technology, www.diamond-materials.com.

"Monocrystalline Synthetic Diamond," dated Feb. 8, 2017, p. 1, published by Element Six, www.e6.com.

Patrik Rath et al., "Superconducting single-photon detectors integrated with diamond nanophotonic circuits," Light: Science & Applications, dated Oct. 9, 2015, pp. 1-8, vol. 4, published by CIOMP, Germany.

Nico Gruhler et al., "Diamond on aluminum nitride as a platform for integrated photonic circuits," Physica Status Solidi A 213, dated Jun. 20, 2016, pp. 2075-2080, No. 8, published by Wiley-VCH Verlag GmbH & Co. KGaA, Weinheim, DE.

Igor Aharonovich et al., "Homoepitaxial Growth of Single Crystal Diamond Membranes for Quantum Information Processing," Advanced Optical Materials, dated 2012, pp. 54-59, No. 24, published by Wiley-VCH Verlag GmbH & Co. KGaA, Weinheim, DE.

Brian R. Patton et al., "Optical properties of single crystal diamond microfilms fabricated by ion implantation and lift-off processing," Diamond & Related Materials 21, dated Sep. 29, 2011, pp. 16-23, published by Elsevier B.V., Amsterdam, Netherlands.

B. J. M. Hausmann et al., "Integrated High-Quality Factor Optical Resonators in Diamond," Nano Letters, dated Feb. 21, 2013, pp. 1898-1902, No. 13, published by American Chemical Society, Washington, US.

N. R. Parikh et al., "Single-crystal diamond plate liftoff achieved by ion implantation and subsequent annealing," Applied Physics Letters, dated Dec. 28, 1992, pp. 3124-3126, vol. 61, No. 26, published by American Institute of Physics, New York, US.

* cited by examiner

SEMI-FINISHED PRODUCT, METHOD FOR THE PRODUCTION THEREOF AND COMPONENT PRODUCED THEREWITH

CROSS-REFERENCE TO RELATED APPLICATIONS

This application claims priority under 35 USC § 119 to European patent application 17159462.5 filed Mar. 6, 2017, the entire contents of which are hereby incorporated by reference.

TECHNICAL FIELD

The invention relates to a semi-finished product including a substrate with a first side and an opposite second side, wherein at least one diamond layer is arranged on the first side.

BACKGROUND

N. Gruhler et al.: Diamond on aluminium nitride as a platform for integrated photonic circuits, Phys. Stat. Sol A (2016) vol. 213, issue 8, pages 207-2080 discloses to deposit a polycrystalline diamond layer heteroepitaxially from the gas phase and to subsequently produce waveguides made of diamond as part of integrated optical components by structuring and etching.

However, the strong attenuation of optical signals resulting from the large number of crystal defects of the polycrystalline diamond is disadvantageous in connection with this known optical component. Therefore, waveguides of integrated optical components are produced from other materials, e.g. $SiO_2$, ZnSe or Ge, for technical applications. However, these materials have the drawback that the refractive index is considerably lower than in the case of diamond. Furthermore, the band gaps of these materials are considerably smaller, such that light of shorter wavelengths is strongly absorbed on account of the generation of electron-hole pairs. Finally, the heating also leads to the generation of free charge carriers, as a result of which the known materials also lose their transparency to infrared light at high temperatures.

BRIEF DESCRIPTION OF THE DRAWINGS

The embodiments may be better understood with reference to the following drawings and description. The components in the figures are not necessarily to scale.

DETAILED DESCRIPTION

Figure 1:
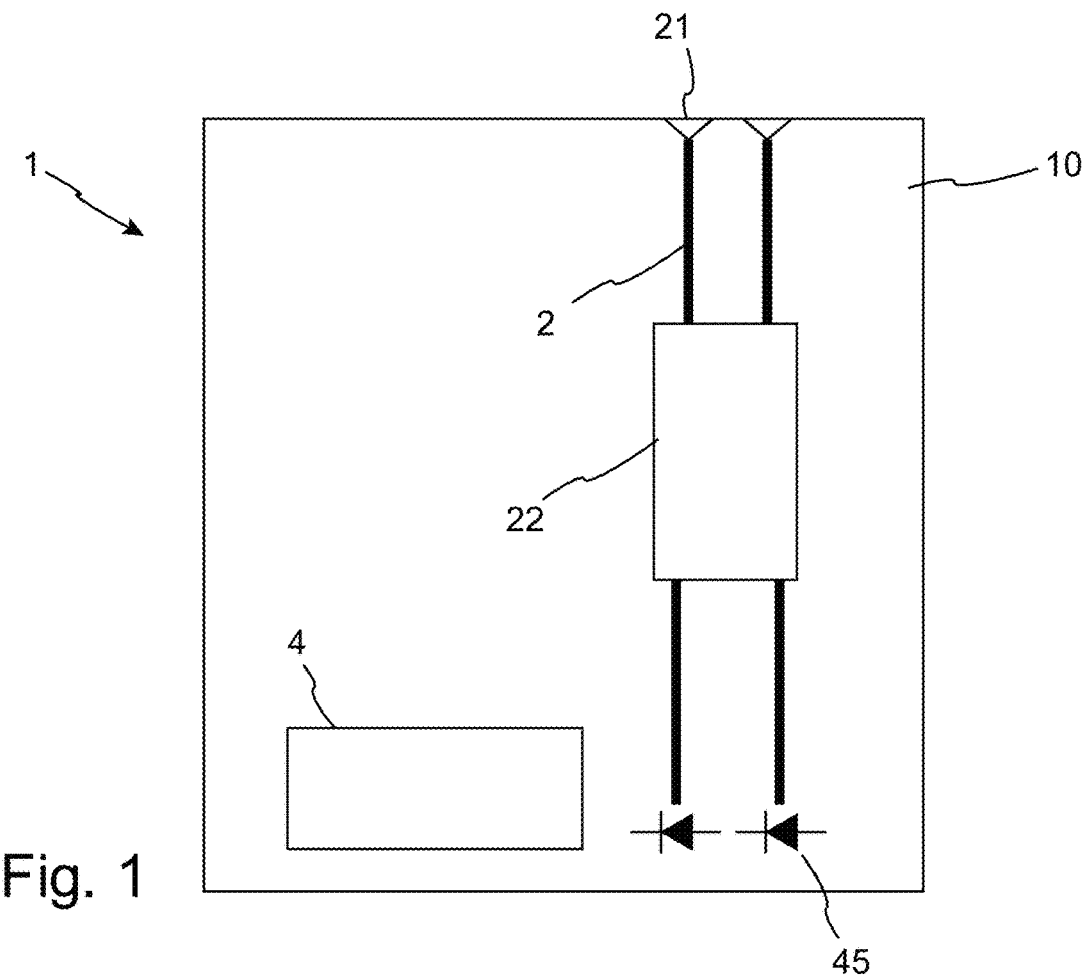
FIG. 1 shows a schematic diagram of an integrated optical component.

A semi-finished product may be provided for producing integrated optical components, said semi-finished product having a low attenuation of optical signals and a high refractive index as well as being suitable for high-temperature applications.

The invention proposes a semi-finished product including a substrate with a first side and an opposite second side. The substrate can comprise, or consist of, e.g. an oxide and/or a nitride and/or silicon oxide and/or silicon nitride and/or silicon oxynitride and/or silicon carbide and/or silicon and/or sapphire and/or glass and/or a III-VI compound semiconductor and/or aluminum nitride. The substrate can have a homogeneous structure, i.e. only consist of a single layer of material. In other embodiments of the invention, the substrate itself can be composed of a plurality of individual layers. In some embodiments of the invention, the substrate can have a lateral structuring and can be designed as an integrated electronic circuit or comprise an integrated circuit.

At least one layer is arranged on the first side of the substrate and comprises, or consists of, monocrystalline diamond. In comparison with a known polycrystalline diamond, the monocrystalline diamond has a smaller number of crystal defects, e.g. grain boundaries, dislocations, phase boundary interfaces, inclusions or other defects. This reduces the scattering and/or refraction of the light propagating inside the diamond, as a result of which optical signals can propagate with lower attenuation.

Diamond is a semiconductor with a band gap of about 5.5 eV. On the one hand, this also allows the use of short-wave optical signals from the visible or near-ultraviolet spectrum in corresponding optical components. In addition, minority charge carriers are only produced to a very small extent even at high temperatures, and therefore diamond maintains its transparency even at high operating temperatures. Finally, diamond has a very high refractive index of about 2.4. As a result, integrated optical components on the basis of the semi-finished product according to the invention can have an improved efficiency and/or a wider field of use than known optical components on the basis of germanium, zinc selenide or sapphire.

For the production of the semi-finished product, the invention proposes to deposit the diamond layer homoepitaxially on an auxiliary substrate made of diamond and to subsequently separate it from the auxiliary substrate and apply it on one side or both sides of the substrate. This avoids a lattice mismatch between auxiliary substrate or substrate and diamond layer when the diamond is deposited from the gas phase, and therefore the crystal quality is improved as described above.

The semi-finished product according to the invention can be processed further into integrated optical components by subsequent structuring. The diamond layer on the substrate can be structured by masking and subsequent wet-chemical or dry-chemical etching. Alternatively, the diamond layer can be structured by laser material processing.

At least one micro-optical component can be formed by structuring the diamond layer. In some embodiments of the invention, this component can be selected from a waveguide and/or a laser and/or an amplifier and/or a multimode interference coupler (MMI) and/or a mixer and/or a frequency multiplier and/or an optical parametric oscillator and/or an interferometer and/or an arrayed waveguide grating (AWG). In some embodiments of the invention, a plurality of such components can be arranged on a substrate to carry out complex functions of the optical measurement and communications engineering or metrology. In some embodiments of the invention, micro-optical components can be integrated together with microelectronic and/or micromechanical components to further increase the functional diversity of the thus produced component. Since the production can be carried out with established techniques of microelectronics, it would easily be possible to integrate the manufacturing method into existing process chains.

For example, a waveguide can be produced by structuring the diamond layer. The waveguide can be designed as a multimode waveguide and/or as a single-mode waveguide. The waveguide comprises at least one core. The core is surrounded by an additional material having a smaller refractive index. This can also be ambient air or a protective gas on account of the high refractive index which diamond has. Optical signals are totally reflected on the boundaries of the core and are in this way guided in the interior of the waveguide along the longitudinal extension thereof. In the same way, more complex components can also be realized.

In some embodiments of the invention, at least one waveguide can be produced through structuring the diamond layer by masking with a metallic mask and subsequent plasma etching. As a result, single-mode and multi-mode waveguides can be produced at precisely defined places in the substrate, and it is thus possible to prepare a defined geometry of the semi-finished product.

Beginning and end of the waveguide can be provided with one coupling element each, by means of which it is possible to couple in optical signals from a fiber optics or a free beam. Alternatively, light sources and/or detectors can also be integrated on the substrate, e.g. photodiodes, CCD sensors, CMOS sensors, semiconductor lasers, light-emitting diodes and/or superluminescent diodes.

In some embodiments of the invention, the diamond layer of the semi-finished product can have a thickness of about 1 μm to about 6 μm or of about 2 μm to about 5 μm. As a result, single-mode waveguides can also be produced.

In some embodiments of the invention, the diamond layer of the semi-finished product can have a surface area of between about 450 mm$^2$ and about 45000 mm$^2$ or between about 1500 mm$^2$ and about 20000 mm$^2$ or between about 1900 mm$^2$ and about 7900 mm$^2$. Since the diamond layer used according to the invention is deposited from the gas phase in some embodiments of the invention, the size of the semi-finished product is not limited to the size of typically occurring natural diamond single crystals.

In some embodiments of the invention, an insulating layer can be arranged between the substrate and the diamond layer. The insulator can have a specific resistance between about 10$^7$ Ω·cm and about 10$^{16}$ Ω·cm. The insulating layer can additionally be chemically inert and in this way prevent a further oxidation of the substrate. As a result, the semi-finished product according to the invention becomes stable for a long time, and an influence of electrical and/or electronic components on and/or in the substrate is avoided. In addition, the insulating layer can also improve the adhesive strength between the diamond layer and the substrate in some embodiments of the invention.

The insulating layer can be produced by sputtering, vapor deposition or CVD processes. This leads to a good control of the composition and thus the chemical, electrical and mechanical properties.

In some embodiments of the invention, at least one microelectronic component can be arranged in the substrate. In some embodiments of the invention, such a component can be selected from at least one conductor loop and/or at least one antenna and/or at least one transistor and/or at least one capacitor and/or at least one resistor and/or at least one optoelectronic component. Such a component and/or a plurality of components as an integrated circuit within the substrate can serve for the signal generation, the signal selection or the signal analysis. For example, a light source and/or a light detector can be integrated on the substrate, e.g. a semiconductor laser, a light-emitting diode, a photodiode or a CCD detector.

In some embodiments of the invention, the connection between the diamond layer and the substrate can be made by direct wafer bonding and/or van der Waals forces or surface activated bonding or plasma activated bonding or soldering or adhering. For this purpose, the surfaces of the diamond layer and/or of the substrate can be polished to a low roughness of less than 50 nm or less than 10 nm or less than 2 nm. This can be accomplished by mechanical polishing and/or plasma etching or plasma polishing. A plasma which comprises oxygen can be used as etchant. Alternatively, it is possible to use a plasma which comprises oxygen and argon.

In some embodiments of the invention, the diamond layer can be attached to a carrier before it is removed from the auxiliary substrate. The carrier can be attached by wax or adhesive or by soldering. This facilitates the handling of the diamond layer during the transfer onto the substrate.

The carrier can be removed by heating the substrate with the diamond layer arranged thereon. In some embodiments of the invention, the surface of the diamond layer can then be subjected to a purification step.

The invention shall be explained in more detail below by means of drawings without limiting the general inventive concept, wherein FIG. 1 shows a schematic diagram of an integrated optical component in the view.

Figure 2:
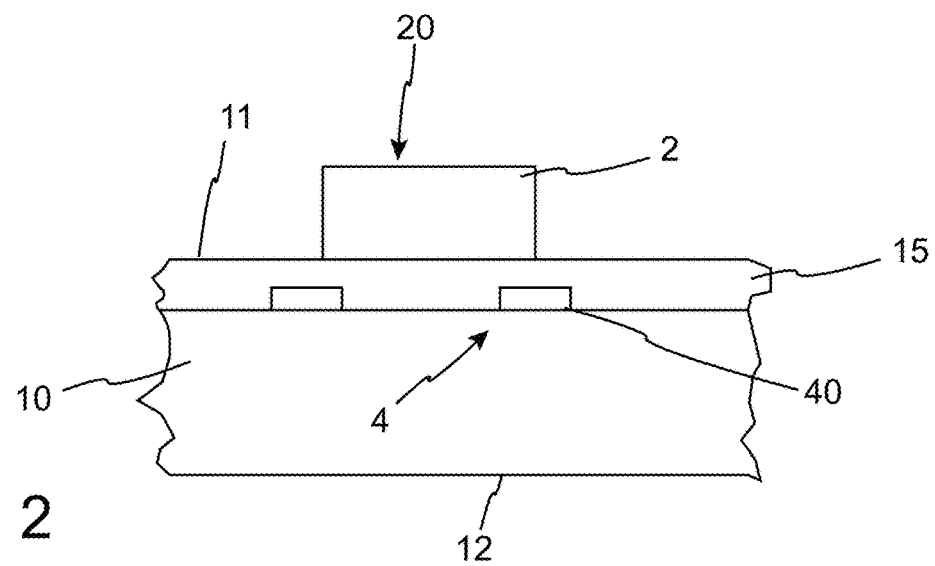
FIG. 2 shows a schematic diagram of an integrated optical component in section.

FIG. 2 shows a schematic diagram of an integrated optical component in section.

FIGS. 3 to 9 explain method steps for producing a semi-finished product according to the invention.

FIGS. 10 to 15 explain method steps for producing an integrated optical component from a semi-finished product according to the invention.

FIG. 1 explains a schematic diagram of an integrated optical component in the view. FIG. 2 shows a section from the cross-section through this integrated optical component.

FIGS. 1 and 2 show a substrate 10, which can comprise e.g. silicon, oxide ceramics, a nitride or a III-V compound semiconductor. The substrate 10 itself can, in turn, be composed of a plurality of individual layers and optionally also be structured laterally, such that the substrate 10 can also comprise a micromechanical component or an integrated electronic circuit 4. For example, a light source or a photoreceiver 45 can be integrated on the substrate 10. In addition, the substrate 10 can, of course, comprise further electronic components, e.g. a spectrometer, an amplifier, a discriminator, an A/D converter or further components known per se.

The substrate 10 has a first side 11 and an opposite second side 12. In the illustrated embodiment, a diamond layer 20 is arranged on the first side 11. In other embodiments of the invention, the diamond layer 20 can also be applied on the second side or on both sides.

An insulating layer 15 is disposed between the diamond layer 20 and the substrate 10. The insulating layer 15 can comprise e.g. a nitride, an oxide or an oxynitride. It can effect an electric insulation between substrate and waveguide 2, ensure the adhesive strength of the waveguides 2 on the substrate 10 or take over further tasks not specified herein. It should be noted that the insulating layer 15 is optional and can also be omitted in other embodiments of the invention.

The diamond layer 20 was then structured laterally to produce waveguides 2 and a multimode interference coupler 22 on the substrate 10. A 2×2 MMI is shown which mixes optical signals from the input waveguides and transfers them into the output waveguides. In other embodiments of the invention, other optical components can be produced. It should be understood that the diagram is merely to be taken as an example.

Each of the waveguides 2 has a thickness of about 1 μm to about 5 μm. The width of the waveguides is selected in such a way that they are designed as either single-mode waveguides or multi-mode waveguides. As a result, light of predeterminable wavelengths can be filtered. This can have a positive influence on the signal/noise ratio.

The input waveguides 2 end in each case at least at one associated coupling element 21, via which light of a light source known per se can be coupled in. The light source can be e.g. a semiconductor laser, a superluminescent diode, a light-emitting diode or any other light source known per se or fiber optics. In some embodiments, the light source can emit light having a wavelength of between about 2500 and about 300 nm. In some embodiments of the invention, the light source can emit light having a wavelength of about 1600 nm to about 500 nm and/or light having a wavelength of about 800 nm to about 550 nm.

Furthermore, the drawings show an electronic component 4, which can be arranged within the substrate 10 or on the direct surface thereof and can be embedded in the insulating layer 15. In the illustrated embodiment, the component 4 comprises an integrated circuit for signal selection and/or decoding as well as conducting paths 40, which are made from an electrically conductive material. For example, the conducting paths 40 can comprise a metal or an alloy which were deposited on the substrate 10 and were then structured by masking and etching.

FIGS. 3 to 9 explain method steps by means of which a semi-finished product according to the invention can be produced. The manufacturing method should here be regarded as an example. Of course, the proposed semi-finished product can also be produced in any other way.

Figure 3:
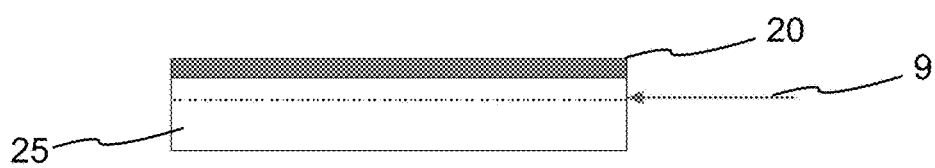
FIG. 3 shows the production of diamond on an auxiliary substrate.

FIG. 3 explains the production of diamond 20 on an auxiliary substrate 25. In the illustrated embodiment, the auxiliary substrate 25 is a monocrystalline diamond. The diamond 20, which subsequently forms the layer 20, can be deposited on the auxiliary substrate 25 homoepitaxially from the gas phase. For this purpose, a plurality of methods known per se are available. For example, the diamond layer 20 can be produced by hot filament CVD or by plasma-enhanced CVD. These methods are known to a person skilled in the art. The invention does not teach the use of a special manufacturing method for diamond 20 as a solution principle.

The diamond layer 20 has no lattice mismatch with respect to the auxiliary substrate 25 due to the homoepitaxial deposition on diamond, and therefore the crystal quality is improved.

The diamond layer 20 is then separated from the auxiliary substrate 25. This can be done e.g. by laser radiation 9, which breaks up the bonds within the auxiliary substrate 25 or within the diamond layer 20 and produces a separation cut.

Figure 4:
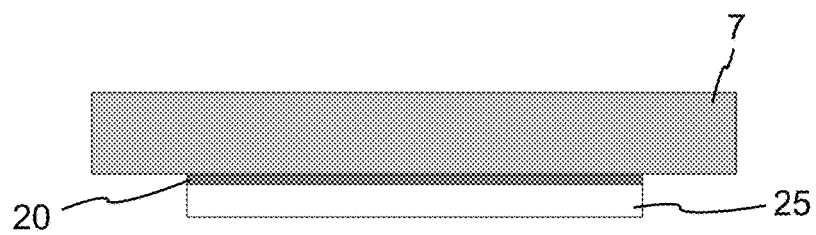
FIG. 4 shows attaching a layer to a carrier.

In order to further process the diamond layer 20, this layer is attached to a carrier 7. This is shown in FIG. 4. The attachment on the carrier 7 can be effected e.g. by means of a wax, an epoxy resin, a solder or any other binder known per se. The carrier 7 can be or comprise e.g. a silicon wafer. In other embodiments of the invention, any other planar layer of material made of a metal, an alloy, ceramics or glass is suitable for the carrier 7. In some embodiments of the invention, the carrier can also be applied before the separation cut 9 is made.

Figure 5:
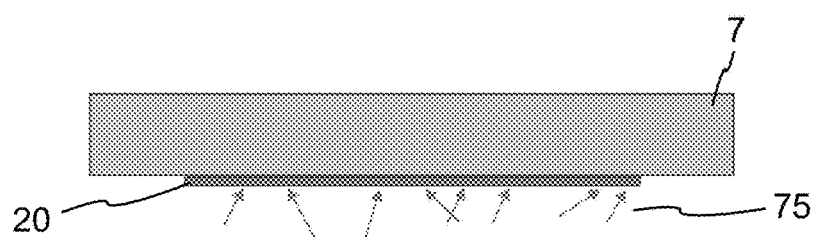
FIG. 5 shows removal of an auxiliary substrate and/or a thinning of a diamond layer.
Figure 6:
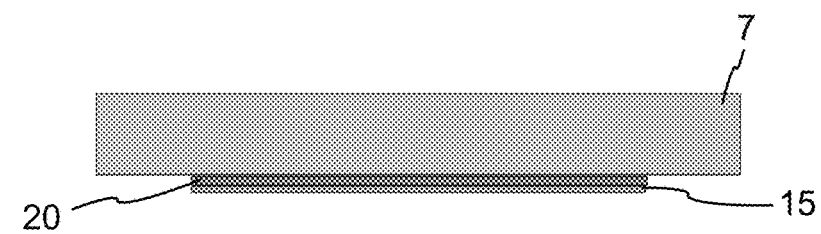
FIG. 6 shows optionally applying an insulating layer to an exposed surface of a diamond layer.

FIG. 5 shows the next method step, namely the complete removal of the auxiliary substrate 25 and/or the thinning of the diamond layer 20. For this purpose, wet-chemical or dry-chemical etching is used, wherein an etchant 75 acts on the surface of the diamond layer that is not covered by the carrier 7 and in this way the auxiliary substrate 25 is fully removed. It should be noted that alternatively to the illustrated etching method the removal of the auxiliary substrate 25 can also be conducted in that the separation cut shown in FIG. 7 can be made closer to the surface of the auxiliary substrate 25 or even in the diamond layer 20. In other embodiments of the invention, the auxiliary substrate 25 can also be removed by machining, e.g. by grinding and/or polishing. In some embodiments of the invention, the auxiliary substrate 25 can also remain in full or in part on the diamond layer 20.

The surface of the diamond layer 20 can have a roughness of less than 50 nm or less than 10 nm or less than 2 nm RMS as a result of the influence of the etchant 75.

After the auxiliary substrate 25 was removed, an insulating layer 15 is optionally applied to the exposed surface of the diamond layer 20. This is explained by means of FIG. 6. The insulating layer 15 can comprise e.g. silicon oxide. Such an insulating layer can be deposited from the gas phase by a sputtering process. In other embodiments of the invention, it is also possible to use, in addition to sputtering methods, other layer deposition methods that are known per se, e.g. chemical vapor deposition or physical vapor deposition. In yet other embodiments of the invention, the insulating layer 15 can also be applied to the substrate 10 or can be omitted. The insulating layer 15 itself can be a layer system made of a plurality of individual layers.

Figure 7:
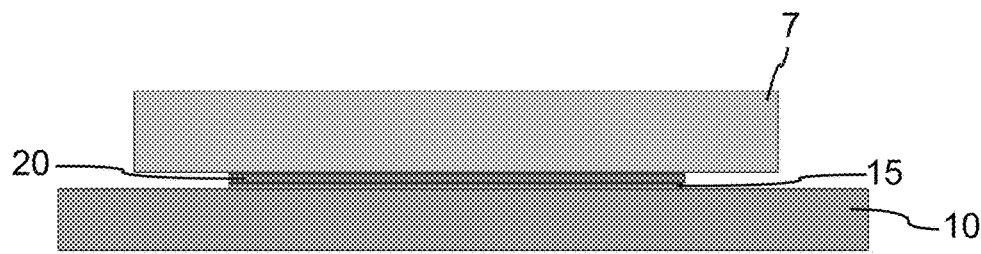
FIG. 7 shows an application of a substrate onto an insulating layer.

FIG. 7 shows the application of a substrate 10 onto the insulating layer 15. The substrate 10 can be bonded to the insulating layer 15 e.g. by means of wafer bonding. This leads to the formation of van der Waals forces between the first side 11 of the substrate 10 and the diamond layer 20.

In other embodiments of the invention, it is of course possible to first apply the insulating layer 15 to the substrate 10 and to then bond it to the diamond layer 20. A connection between the diamond layer 20 and the substrate 10 with or without an intermediate insulating layer 15 is essential to the invention. In order to achieve this objective, a person skilled in the art is familiar with a plurality of methods, e.g. also plasma-activated bonding, surface-activated bonding or also the use of adhesives or solders.

Figure 8:
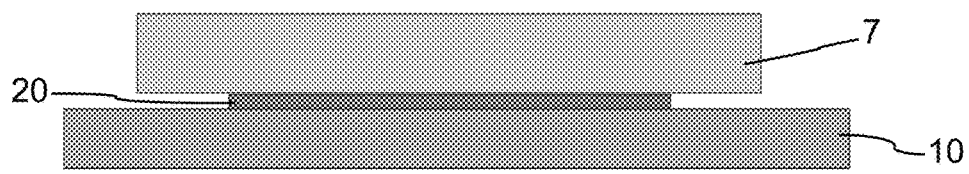
FIG. 8 shows an application of a substrate directly onto a diamond layer without an intermediate insulating layer.

FIG. 8 shows the application of a substrate 10 directly onto the diamond layer 20 without an intermediate insulating layer 15. This procedure can be advantageous if the substrate 10 consists of an insulator anyway or if the substrate 10 comprises no electronic components.

Figure 9:
FIG. 9 shows a semi-finished product after removal of a carrier.

Finally, FIG. 9 shows the resulting semi-finished product after the removal of the carrier 7. For this purpose, the diamond layer 20 with the substrate 10 can be heated to reduce the bonding forces between a wax and/or an adhesive or a solder and the carrier 7 to such a degree that the carrier can be removed in damage-free fashion.

This can be followed by an optional cleaning step to ensure a clean surface of the diamond layer 20. The cleaning can be made in an ultrasonic bath or a plasma.

Figure 10:
FIG. 10 shows an application of a photoresist to a semi-finished product.

The semi-finished product according to the invention can be processed further in subsequent method steps to produce an integrated optical component. For this purpose, FIG. 10 shows the application of a photoresist 80. The photoresist 80 can consist of or comprise such a polymer. The photoresist 80 can be applied e.g. by spin-coating, printing, doctoring or other methods known per se.

Figure 11:
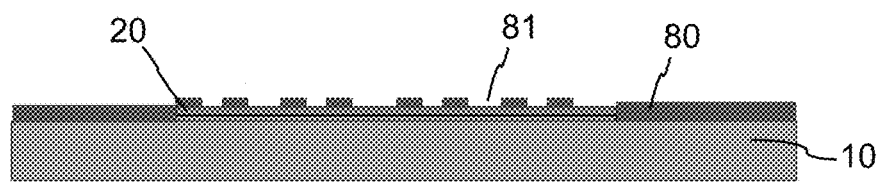
FIG. 11 shows subareas from where photoresist is removed.

After the curing of the photoresist 80, the latter can be structured by exposure using a mask and subsequent development and etching such that first subareas result which are covered with the photoresist and second subareas 81 are left from which the photoresist is removed. This is shown in FIG. 11.

Figure 12:
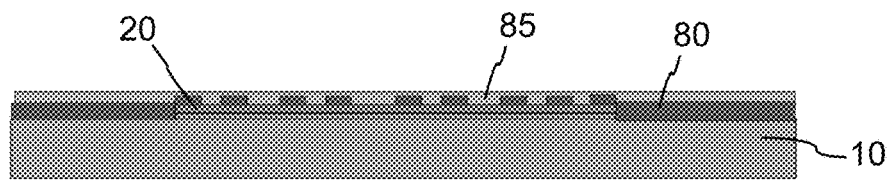
FIG. 12 shows a substrate provided with a metallization.

The substrate 10 is then provided with a metallization 85 which is shown in FIG. 12. The metallization 85 can be produced e.g. by sputtering a pure metal target, by thermal vapor deposition, by ion plating or other methods known per se. The metallization 85 can comprise a plurality of individual layers which can be used e.g. for an improved adhesion.

Figure 13:
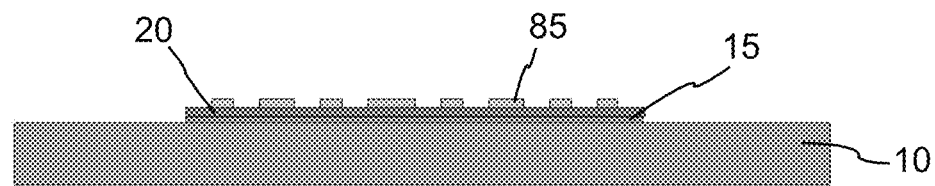
FIG. 13 shows a cross-section through a substrate and diamond layer after a photoresist is removed.
Figure 14:
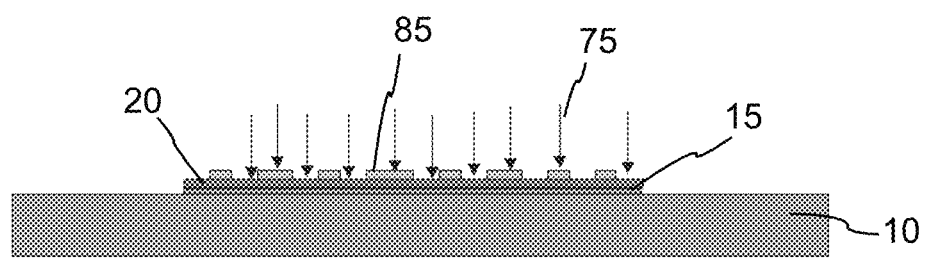
FIG. 14 shows application of a wet-chemical or dry-chemical etching.

FIG. 13 shows the cross-section through the substrate 10 and the diamond layer 20 after the photoresist 80 was removed. This also effects that the subarea of the metallization 85 on the photoresist 80 is removed such that subareas of the diamond layer 20 are then exposed and other subareas of the diamond layer 20 are covered with the metallization 85.

As explained in FIG. 14, this is again followed by wet-chemical or dry-chemical etching. In some embodiments of the invention, the etching can be carried out by means of a plasma. The plasma can comprise or consist of oxygen or a mixture of argon and oxygen. The etchant 75 thus attacks the uncovered subareas of the diamond layer 20. However, the subareas protected by the metallization 85 are not attacked by the etchant 75.

Figure 15:
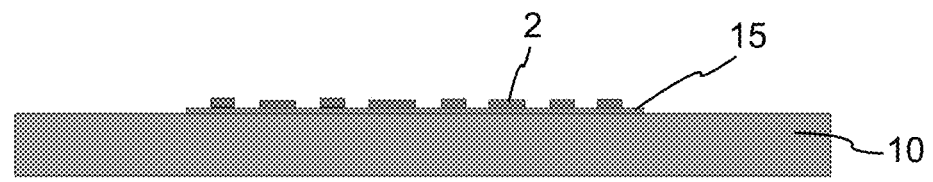
FIG. 15 shows a cross-section through a wafer after removal of metallization.

FIG. 15 shows the cross-section through the wafer after the removal of the metallization 85. At that time, waveguides 2 or other micro-optical components are arranged on the substrate 10, said components consisting of monocrystalline diamond with high crystal quality. The monocrystalline defect-reduced material of the diamond 20 has a low defect density in relation to polycrystalline diamond, and therefore light propagating inside the waveguide 2 is less weakened.

Of course, the invention is not limited to the illustrated embodiments. Therefore, the above description should not be considered limiting but explanatory. The below claims are understood to mean that a described feature is available in at least one embodiment of the invention. This does not rule out the presence of further features. If the claims and the above description define "first" and "second" embodiments, this designation serves to distinguish between two similar embodiments without determining an order.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

The invention claimed is:

1. An integrated optical component comprising:
   at least one diamond layer; and
   at least one substrate having a first side and an opposite second side, wherein the at least one diamond layer is arranged on the first side of the at least one substrate, wherein the at least one diamond layer comprises monocrystalline diamond, and the at least one substrate comprises a material different from the at least one diamond layer, wherein
   the at least one diamond layer is structured to form at least one component comprising a waveguide, a laser, an amplifier, a multimode interference coupler (MMI), a mixer, a frequency multiplier, an optical parametric oscillator, and/or an interferometer,
   wherein a connection between the at least one diamond layer and the at least one substrate is a direct wafer bond, a surface activated bond, a plasma activated bond, a solder connection, or an adhesive bond, and
   wherein the at least one diamond layer has a surface area of between about 450 mm$^2$ and about 45000 mm$^2$.

2. The integrated optical component according to claim 1, wherein at least one electronic or optoelectronic component is arranged in the at least one substrate, and/or wherein the at least one substrate consists of a plurality of individual layers.

3. The integrated optical component according to claim 2, wherein the at least one electronic or optoelectronic component comprises at least one conductor loop, at least one antenna, at least one transistor, at least one capacitor, and/or at least one resistor.

4. The integrated optical component according to claim 1, wherein an insulating layer is arranged between the at least one substrate and the at least one diamond layer.

5. The integrated optical component according to claim 1, wherein the at least one substrate comprises an oxide, a nitride, silicon oxide, silicon nitride, silicon oxynitride, silicon carbide, silicon, sapphire, glass, a III-VI compound semiconductor, and/or aluminum nitride.

6. The integrated optical component according to claim 1, wherein the at least one diamond layer has a thickness of about 2 µm to about 5 µm.

7. A method for producing an integrated optical component, the method comprising:
   causing homoepitaxial production of a monocrystalline diamond layer on an auxiliary substrate, wherein the diamond layer has a surface area of between about 450 mm$^2$ and about 45000 mm$^2$;
   removing the diamond layer from the auxiliary substrate;
   applying the diamond layer to a substrate, which comprises a material different from the diamond layer, by means of direct wafer bonding or surface activated bonding or plasma activated bonding or soldering or adhering; and structuring the diamond layer to form at least one component comprising a waveguide, a laser, an amplifier, a multimode interference coupler (MMI), a mixer, a frequency multiplier, an optical parametric oscillator, and/or an interferometer.

8. The method according to claim 7, further comprising attaching the diamond layer to a carrier before a removal of the auxiliary substrate.

9. The method according to claim 7, wherein the substrate comprises an oxide, a nitride, silicon oxide, silicon nitride, silicon oxynitride, silicon carbide, silicon, sapphire, glass, a III-VI compound semiconductor, and/or aluminum nitride.

10. The method according to claim 7, wherein the diamond layer has a thickness that is within a range of about 2 µm to about 5 µm.

11. The method according to claim 8, wherein the carrier is attached by a wax, an adhesive, or a solder connection, and/or wherein the diamond layer is cleaned after a carrier is removed.

12. The method according to claim 7, wherein the applying the diamond layer to the substrate further comprises attaching the diamond layer to a carrier by a wax, an adhesive, or a solder connection.

13. The integrated optical component according to claim 7, wherein the structuring the diamond layer further comprises plasma etching or wet etching.

14. The method according to claim 10, wherein the diamond layer has a thickness that is within a range of about 1 µm to about 6 µm.

15. The integrated optical component according to claim 6, wherein the at least one diamond layer has a thickness of about 1 µm to about 6 µm.

16. The integrated optical component according to claim 1, wherein the substrate does not include diamond.

* * * * *